United States Patent [19]

Minami

[11] Patent Number: 5,300,378
[45] Date of Patent: Apr. 5, 1994

[54] METHOD OF PRODUCING A PHASE SHIFTING MASK

[75] Inventor: Hiroyuki Minami, Itami, Japan

[73] Assignee: Mitsubishi Denki Fabusbhiki Kaisha, Tokyo, Japan

[21] Appl. No.: 928,639

[22] Filed: Aug. 14, 1992

Related U.S. Application Data

[62] Division of Ser. No. 707,753, May 30, 1991, abandoned.

[30] Foreign Application Priority Data

Jun. 15, 1990 [JP] Japan ................................ 2-158420

[51] Int. Cl.$^5$ ............................................. G03F 9/00
[52] U.S. Cl. ........................................ 430/5; 430/311; 430/323; 430/324
[58] Field of Search .................. 430/5, 22, 321, 311, 430/312, 314, 323, 324, 945

[56] References Cited

U.S. PATENT DOCUMENTS 4,762,396  8/1988  Dumant et al. ...................... 430/5
4,948,706  8/1990  Sugihara et al. .................. 430/311
5,045,417  9/1991  Okamoto ............................ 430/5

FOREIGN PATENT DOCUMENTS 0234547  2/1987  European Pat. Off. .
6267514  3/1987  Japan .

OTHER PUBLICATIONS

Levenson et al., "Improviding Resolution In Photolithography With A Phase-Shifting Mask", IEEE Transactions On Electron Devices, vol. ED-29, No. 12, Dec. 1982, pp. 1828-1836.
Levenson et al., "The Phase-Shifting Mask II; Imaging Simulations And Submicrometer Resist Exposures", IEEE Transactions On Electron Devices, vol. ED-31, No. 6, Jun. 1984, pp. 753-763.

Primary Examiner—Marion E. McCamish
Assistant Examiner—S. Rosasco
Attorney, Agent, or Firm—Leydig, Voit & Mayer

[57] ABSTRACT

A mask for use in an optical exposure apparatus with single wavelength light includes a light shielding film pattern having two spaced apart portions on a transparent substrate, a transparent thin film for shifting the phase of light transmitted through the mask disposed in the aperture between the light shielding film portions and spaced from the light shielding film portions. The resolution and contrast of the image of the pattern projected onto a wafer are enhanced and the resolution and depth of focus of the photoresist on which the pattern is projected are improved.

6 Claims, 9 Drawing Sheets

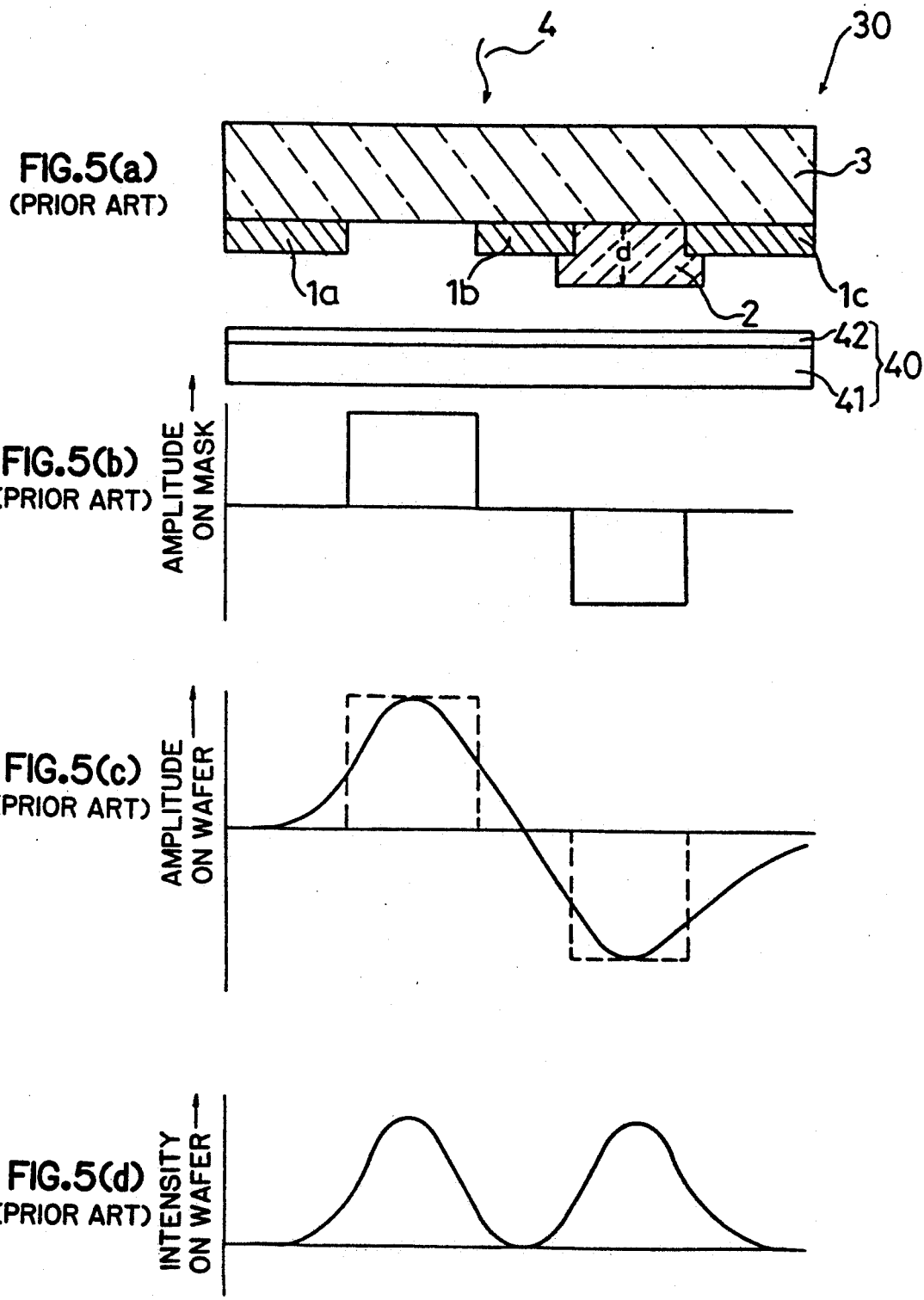

METHOD OF PRODUCING A PHASE SHIFTING MASK

This application is a divisional of application Ser. No. 07/707,753, filed May 30, 1991, now abandoned.

FIELD OF THE INVENTION

The present invention relates to a mask pattern used in a single wavelength optical exposure apparatus and a production method therefor.

BACKGROUND OF THE INVENTION

FIGS. 4(a) to 4(d) show a principle of patterning a mask pattern, which is generally used, in which FIG. 4(a) shows cross-sectional structures of a mask pattern and exposed wafer, FIG. 4(b) shows the amplitude distribution of the incident light on the mask pattern, FIG. 4(c) shows the amplitude distribution of light on a wafer transmitted through the mask pattern, and FIG. 4(d) shows the intensity distribution of the light on the exposed wafer.

In these figures, reference numeral 30 designates a mask pattern comprising light shielding films 1a, 1b, and 1c and a glass substrate 3. The light shielding films 1a, 1b, and 1c comprise metal such as Cr disposed on a first surface of the glass substrate 3. Reference numeral 4 designates monochromatic light incident on a second surface of the glass substrate 3. Reference numeral 40 designates a wafer which is to be exposed with the light 4 transmitted through the mask pattern 30 comprising a substrate 41 and a resist layer 42 disposed on the substrate 41.

In FIG. 4(a), when exposure light 4 having a single wavelength is incident on the mask pattern from above, the amplitude distribution of the incident light on the mask pattern 30 has the same phase as shown in FIG. 4(b). The amplitude of the incident light which has passed through the mask pattern 30 is distributed on the wafer 40 as shown in FIG. 4(c). In FIG. 4(c), the broken line represents the amplitude distribution of the light on the mask pattern 30 and the solid line represents the amplitude distribution of light on the wafer 40. When the light incident on the mask pattern 30 has the same phases and the light shielding film 1b provided in the aperture between the shielding films 1a and 1c is a fine pattern, diffracted diffraction occurs, thereby resulting in the amplitude distribution as shown by the solid line. Hence, the intensity distribution of the incident light on the wafer 40 is as shown in FIG. 4(d) and fine resist patterns cannot be produced on the substrate 41.

A phase-shifting method that has been developed in order to solve the above-described problems will be explained.

FIGS. 5(a) to 5(d) show a principle of patterning by using the phase-shifting method, in which FIG. 5(a) shows a cross-sectional view of a mask pattern in the phase-shifting method, FIG. 5(b) shows the amplitude distribution of the incident light on the mask pattern, FIG. 5(c) shows the amplitude distribution of light on the wafer which is to be exposed with the light transmitted through the mask pattern, and FIG. 5(d) shows the intensity distribution of light on the wafer transmitted through the mask pattern.

In these figures, reference numerals 1a, 1b, and 1c designate light shielding films, reference numeral 3 designates a glass substrate, reference numeral 2 designates a transparent thin film comprising an insulating film such as SiO or SiN for shifting the phase of exposure light (hereinafter referred to as a shifting film), and reference numeral 30 designates a mask pattern comprising the light shielding films 1a, 1b, and 1c, the glass substrate 3, and the shifting films 2. Reference numeral 4 designates monochromatic light. Reference numeral 40 designates a wafer which is to be exposed with the light 4 transmitted through the mask pattern 30 comprising a substrate 41 and a resist layer 42 disposed on the substrate 41.

In FIG. 5(a), the shifting film 2 is produced to invert the phase of the light transmitted through shifting film 2 by 180 degrees and the thickness thereof is represented by:

$$d = \lambda/2(n-1)$$

where, d is thickness of the shifting film, $\lambda$ is wavelength of the light, and n is refractive index of the shifting film.

When the monochromatic light 4 is incident from above on the mask pattern 30 on which the shifting film 2 is produced to a required thickness d, the light at a places in the pattern where light shielding film is absent and where the shifting film 2 is present has a difference of 180 degrees in phase relative to the light at a place in the pattern where light shielding film is absent and the shifting film 2 is also absent. Therefore the amplitude distribution of light as shown in FIG. 5(b) appears on the mask pattern 30. The light which has passed through the mask pattern 30 reaches the wafer 40, and the light on the wafer 40 has the amplitude distribution of FIG. 5(c). In FIG. 5(c), the dotted line represents the amplitude distribution of the light on the mask pattern 30, and a solid line represents amplitude distribution of light on the wafer 40. As shown in this figure, since the amplitude of light on the mask pattern 30 varies due to inversion of the phase at opposite sides of the light shielding film pattern 1b, there is a place at the light shielding film pattern 1b where the amplitude of light is zero regardless of light diffracted where light shielding film is absent. In this way, as shown in FIG. 5(d), there is a place where the light intensity is zero where the light shielding film pattern 1b is located, on the substrate exposed with light, thereby enabling fine patterns to be produced.

The above-described phase-shifting method is effective in a repeating pattern of such as line and space.

On the other hand, in a case of a single pattern such as a space, a supplementary pattern which has an inverted phase is provided around the pattern to obtain fin patterns.

FIGS. 6(a) to 6(d) show a method of miniaturizing a single pattern using the phase-shifting method, disclosed in Japanese Patent Published Application No. 62-67514, in which FIG. 6(a) is a cross-sectional view of mask pattern, FIG. 6(b) shows an amplitude distribution of the incident light on the mask pattern, FIG. 6(c) shows the amplitude distribution of light on a wafer exposed with the light transmitted through the mask pattern, and FIG. 6(d) shows the intensity distribution of light on the wafer.

In all figures, like elements are given the same numerals, and reference numerals 1d to 1i designate light shielding films. Reference numerals 2c and 2d designate 180 degree phase-shifting films. Reference numeral 10 designates an aperture. Reference numerals 14a to 14d designate supplementary aperture patterns produced at both sides of the aperture pattern 10, the width of each of which is too narrow to be imaged by an optical exposure apparatus.

When patterns are transferred onto the resist film 42 provided on the substrate 41 using a mask pattern 30 shown in FIG. 6(a), the amplitude distribution of light on the mask pattern 30 is as shown in FIG. 6(b), the phase of light which has passed through the aperture patterns 14b and 14c is inverted with respect to that of light which has transmitted through the aperture patterns 14a and 14d. The amplitude and intensity distribution of light on the wafer 40 exposed with light are as shown in figures 6(c) and 6(d), respectively, and it is found that only the light which has passed through the aperture pattern 10 is largely transferred.

A method of producing the mask pattern of FIG. 5(a) will be described with reference to FIGS. 7(a) to 7(f).

Firstly, a light shielding film 1 comprising metal such as Cr is produced on the entire surface of glass substrate 3 by deposition or sputtering, and a resist film 11 is plated on the entire surface thereof. Next, the resist 11 is exposed with light to produce desired patterns using an electron beam exposure method. At this time, the light shielding film 1 is grounded to prevent the glass plate 3 from being charged with electric charges due to the light exposure (FIG. 7(a)).

Thereafter, resist patterns 11a to 11c are produced by development (FIG. 7(b)), and the light shielding film 1 is etched using the resist patterns 11a to 11c as a mask to produce light shielding film patterns 1a to 1c, and then the resist patterns 11a to 11c are removed (FIG. 7(c)).

Thereafter, the entire surface of the partially completed device is plated with resist 12 for producing a shifting film and exposed with an electron beam by an electron beam exposure method (FIG. 7(d)), and thereafter it is developed to produce a resist pattern 12a and 12b. Thereafter, a shifting film 2 comprising a transparent thin film such as SiO or SiN is vapor deposited to a desired thickness (d) using the resist pattern 12a and 12b as a mask (FIG. 7(e)), and then a shifting film pattern 2 is produced by lift-off (FIG. 7(f)).

Here, in the process of electron beam exposure of the resist film of FIG. 7(d), light shielding film pattern 1c is required to be grounded or a metal film is required to be formed on the light shielding film pattern 1c to prevent the substrate 3 from being charged by electric charges.

The mask pattern of FIG. 6(a) is produced by an electron beam exposure method in the same way as the above-described method.

The conventional phase-shifting methods used in the line-and-space repeating pattern and single pattern, both have problems in the method of producing the mask pattern 30.

In the prior art production method, photoresist 11 is plated on the glass substrate 3 which is covered with the light shielding film 1, the surface exposed using the electron beam exposure method and developed to produce resist pattern 11a to 11c, light shielding film patterns 1a, 1b, and 1c are produced by etching using the resist pattern 11a to 11c as a mask, and further resist patterns 12a and 12b are produced by using electron beam exposure method and development, and shifting film 2 is produced using the lift-off method. When the electron beam exposure is carried out, grounding is required to prevent the substrate 3 from being charged by irradiation with the electron beam.

However, when the resist 12 is exposed, the light shielding film which is to be grounded is patterned, and light shielding film patterns 1a to 1c are discontinuous on the glass substrate. Therefore, only one pattern such as pattern 1c can be grounded, and the portion between the light shielding films 1a and 1b is not grounded, whereby electrons charge that portion of glass substrate 3.

This charging of substrate causes problems as in the following.

Firstly, in the process of FIG. 7(d), when the position of resist 12 to be exposed is mark-detected relative to the light shielding film patterns 1a and 1b, the mark-detected position is shifted due to the influence of electric charge collected at surface of glass substrate 3 at the time of electric beam scanning, which causes a deviation in the position of the shifting film.

Secondly, as shown in FIGS. 8(a) and 8(b), in a case where only a pattern 1d among light shielding film patterns 1a to 1d is grounded at the time of exposure, the surface of glass substrate 3 is not charged in the vicinity below the light shielding film 1d but is charged at the other portions of the surface of glass plate such as those between the light shielding films 1a and 1b and under the light shielding film 1c (FIG. 8(a)). When a shifting film is deposited by evaporation in this state, the shifting film 2' produced between the shielding films 1c and 1d becomes positionally deviated to the side of the light shielding film 1d, influenced by electric charges stored at a between the shielding films 1a and 1b as shown in FIG. 8(b).

That is, in the prior art mask pattern production method using the phase-shifting method, the substrate is likely to be charged by using the electron beam exposure method, and it is impossible to obtain a desired shifting film pattern just on the light shielding film with high precision. Therefore, there is a large obstacle when the mask pattern is desired to be fine.

SUMMARY OF THE INVENTION

The present invention is directed to solving the above described problems and has for its object to provide a mask pattern having a phase-shifting film with enhanced resolution and contrast of the transferred image.

Another object is to provide a method for producing the mask pattern with high precision in a simple production process.

Other objects and advantages of the present invention will become apparent from the detailed description given hereinafter; it should be understood, and however, that the detailed description and specific embodiment are given by way of illustration only, since various changes and modifications within the spirit and the scope of the invention will become apparent to those skilled in the art from this detailed description.

According to the present invention, a mask pattern comprises a transparent thin film for shifting the phase of light provided at an aperture of a light shielding film disposed on a transparent substrate separated from the light shielding film.

According to the present invention, a method of producing a mask pattern comprises the steps of producing a pattern of a light shielding film having a desired width at a surface of a transparent substrate, producing a positive type photoresist film on the entire surface so as to cover said light shielding film, processing the positive type photoresist film on the light shielding film pattern by exposing the entire surface with light from the rear surface of the transparent substrate in an over-hanging configuration, producing a transparent thin film which shifts the phase of exposure light at the surface of the transparent substrate by evaporation, performing lift-off, and producing a transparent thin film pattern at an aperture of the light shielding film separated from the light shielding film.

According to the present invention, a method of producing a mask pattern comprises the steps of producing a light shielding film on the entire surface of a transparent substrate, producing a photoresist pattern on the light shielding film, processing the light shielding film to a pattern of desired width by performing overetching using the photoresist pattern as a mask, producing a transparent thin film for shifting the phase of the exposure light on the entire surface, and performing lift-off to produce a transparent thin film at an aperture of the light shielding film separated from the light shielding film.

According to the present invention, since a mask pattern comprises a shifting film which is produced at an area having a certain distance from a light shielding film at an aperture of the light shielding film provided on a transparent substrate, the phase of light which is transmitted through the shifting film is reversed. Therefore, when this mask pattern is used in an optical projecting exposure apparatus using a single wavelength, resolution and contrast of the image which is transferred are enhanced.

In the method of producing a mask pattern according to the present invention, a photoresist is plated onto the front surface of the transparent substrate on which light shielding films are produced, an over-hanging configuration pattern is produced by optical exposure of the entire surface from the rear surface of the transparent substrate and development, a shifting film is produced at an aperture of the light shielding film and separated from it by lift-off and the shifting film has a required thickness.

Further, in the method of producing a mask pattern according to the present invention, a photoresist is plated on the entire surface of the transparent substrate on which a light shielding film is produced, a pattern is produced by electron beam exposure, the light shielding film is overetched using a photoresist pattern as a mask to produce a light shielding film pattern having a desired pattern width, a shifting film is deposited by evaporation and produced to a desired thickness and excess material is removed by lift-off. Thereby, the shifting film pattern separated from light shielding film pattern can be produced without requiring electron beam exposure, therefore, a shifting film pattern can be produced self-alignedly high controllability and high precision by simple production processes.

BRIEF DESCRIPTION OF THE DRAWINGS

FIGS. 5(a) to 5(d) are diagrams for explaining the principle of patterning in the phase-shifting method used in the prior art mask pattern;

DETAILED DESCRIPTION OF THE PREFERRED EMBODIMENT

Embodiments of the present invention will be described with reference to the drawings.

First, exposure using a reduction projection exposure apparatus will be explained.

Figure 9:
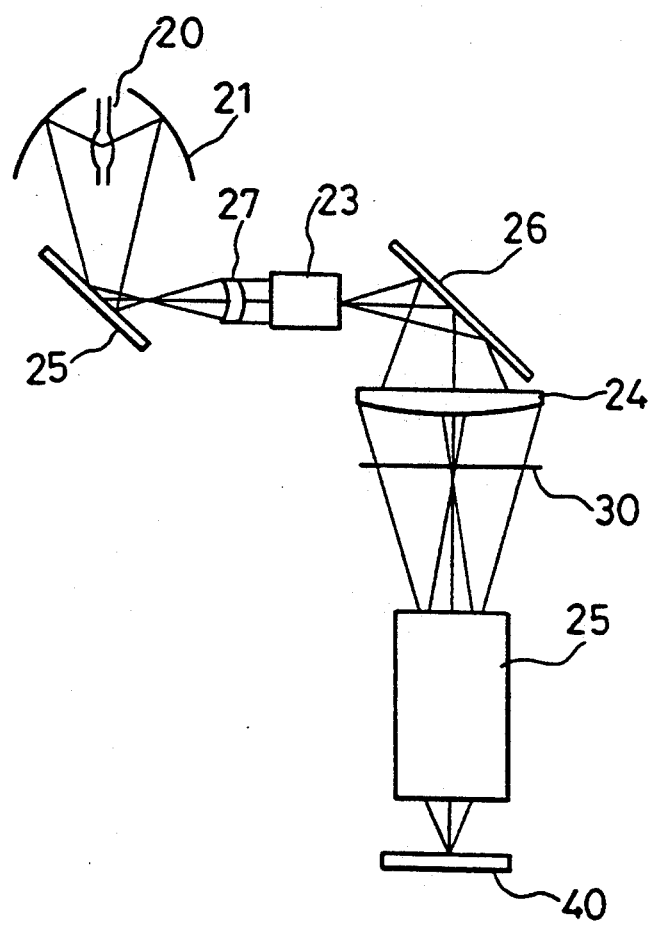

FIG. 9 is a schematic diagram showing a reducing projection exposure apparatus. This system projects a mask pattern onto the wafer via a reduction lens having high resolution and the wafer is moved by a step and repeat system in X-Y direction so as to expose the entire surface of the wafer. In FIG. 9, reference numeral 20 designates a Hg lamp. The light emitted from the Hg lamp 20 is reflected on the elliptical mirror 21 and the flat mirror 25, successively. The light reflected from the flat mirror 25 is converted into a parallel light by the lens 27 and thereafter the parallel light enters into the integrator 23. The integrated light reflected by the flat mirror 26 enters a mask pattern 30 via a condenser lens 24. The light transmitted by the mask pattern 30 is projected onto the wafer 40 having a resist mask through the reduction lens 25.

FIGS. 1(a)–1(e) are diagrams showing the principle of projecting a mask pattern onto a wafer according to an embodiment of the present invention. In FIG. 1(1), reference numeral 30 designates a mask pattern comprising a glass substrate 3 and patterns of light shielding films 1a, 1b, and 1c and phase shifting films 2a and 2b disposed on the rear surface of the glass substrate 3. Phase shifting films 2a and 2b disposed on the rear surface of the glass substrate 3 are spaced from the light shielding films 1a and 1b, and 1b and 1c, respectively. Reference numeral 4 designates an exposure light having a single wavelength incident on the front surface of the glass substrate 3. Reference numeral 40 designates a wafer which is to be exposed with the light 4 transmitted through the mask pattern 30 and it comprises a substrate 41 and a resist layer 42 disposed on the substrate 41 to be exposed.

Figure 1A:
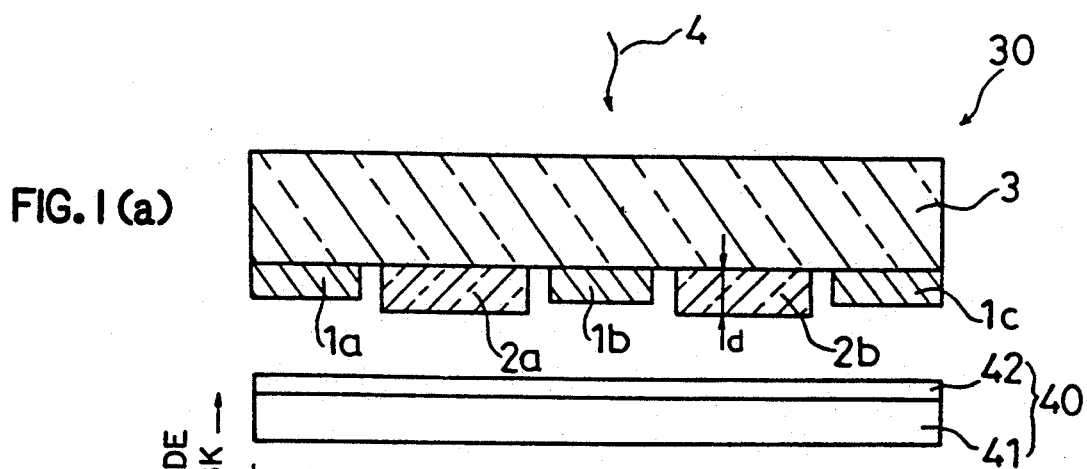
FIGS. 1(a) to 1(e) are diagrams showing the principle of a function of a mask pattern according to a first embodiment of the present invention.
Figure 1B:
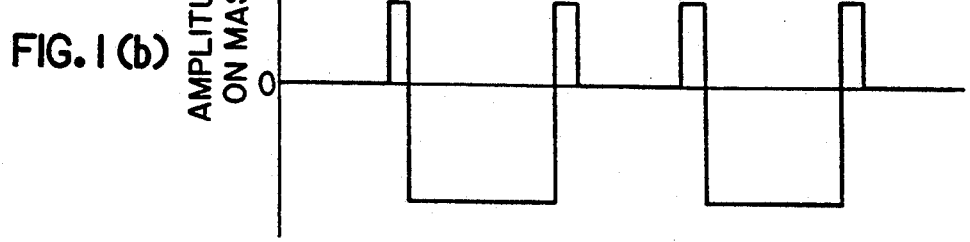

As shown in FIG. 1(a), an exposure light 4 having a single wavelength enters a mask pattern from above. The thickness d of phase shifting films 2a and 2b is represented similarly as in the prior art phase-shifting method by the following formula:

$$d = \lambda/2 \, (n-1) \qquad (1)$$

where, d is thickness of the shifting film, λ is wavelength of exposure light, and n is refractive index of the shifting film.

This thickness is required to reverse the phase of exposure light which transmitted through the shifting film. The intervals between shifting films 2a, 2b and light shielding film patterns 1a, 1b, 1c are equal to the length which cannot be imaged by using this exposure apparatus such as 0.5 to 1 microns or less in a case where the width over which the light shielding film is absent is 5 microns in a mask used in a 1/5 reduction projection exposure apparatus. Then, the light which transmitted through the shifting films 2a and 2b shows the amplitude distribution of FIG. 1(b) on the mask pattern. As shown in this figure, the amplitudes of only the light which is transmitted through the shifting films 2a and 2b has a phase inverted by 180 degrees.

Figure 1C:
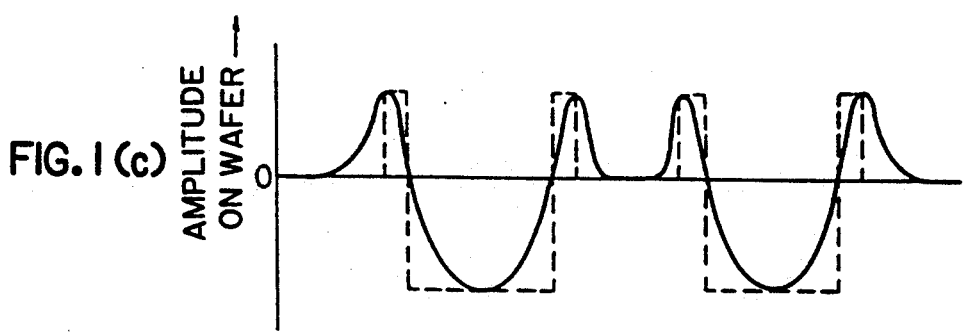

The amplitude distribution of light on the wafer 40 which is exposed with the light which is transmitted through the mask pattern 30 is shown in FIG. 1(c). In this figure, the dotted line represents the amplitude of light on the mask pattern 30 and the solid line represents the amplitude of light on the wafer 40 which is exposed with light. As shown in FIG. 1(c), the amplitude of the light which transmitted through the shifting films 2a and 2b and the amplitude of the light which transmitted through the pattern having neither a light shielding film 1a to 1c nor a shifting film 2a and 2b have a difference in phase by of 180 degrees. Therefore, the amplitude of light at a portion of the wafer confronting both sides of the shifting films 2a and 2b is zero.

Figure 1D:
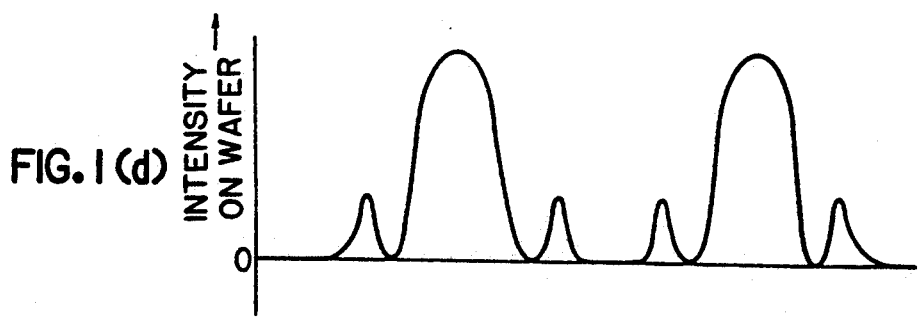

As represented by the light intensity distribution on the wafer 40 shown in FIG. 1(d), the light intensity at a portion of the width corresponding to the width of light which transmitted through the shifting films 2a and 2b can be increased to a value larger than that at a portion of pattern where neither light shielding film nor shifting film is present. Therefore, the resolution and contrast of the pattern image which is projected can be enhanced.

Next, the case where a resist pattern having the width of 0.4 microns on the substrate is imaged using a 1/5 reduction projecting exposure apparatus will be described.

Figure 1E:
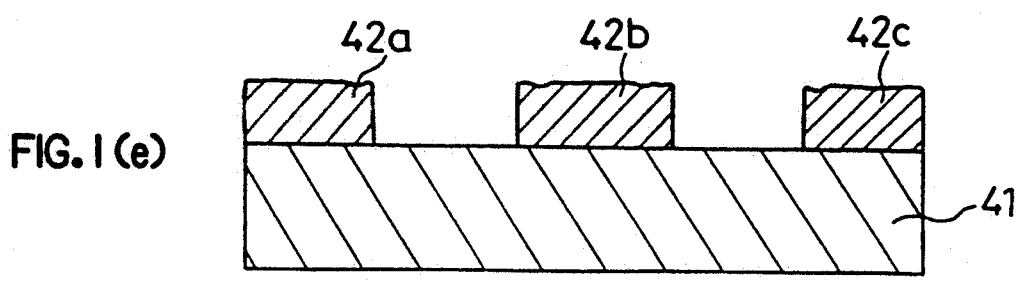

In a case where the widths of shifting film patterns 2a and 2b are determined to be 2 microns, and phase shifting films 2a and 2b are produced at spacing of 0.5 microns from the light shielding film patterns 1a to 1c, respectively, the widths of the light shielding film patterns 1a to 1c are determined to be 1 micron. By this, resist films 42a to 42c which have a pattern width of 0.4 micron can be transferred on the exposed substrate 41 at high precision, as shown in FIG. 1(e).

When the resist patterns 42a to 42c of m microns are imaged on the substrate using a mask pattern 30 of the present invention and an 1/n reduction projecting exposure apparatus, the pattern width is to be established as follows:

shifting film pattern : (m×n) microns
light shielding film pattern : (m×n)−2k microns Here, reference character k represents an interval between the shifting film pattern and the light shielding film pattern.

In the above-described embodiment, the width of the openings between resist patterns 42a to 42c on the substrate 41 are 0.4 microns, but the opening between resist patterns 42a to 42c of 0.3 microns can be easily imaged on the substrate 41 by the mask pattern 30 of the present invention.

A method of producing the mask pattern 30 of FIG. 1(a) is shown in a process flow diagram shown in FIGS. 2(a) to 2(e). In these figures, like elements are given the same numerals as those shown in FIG. 1(a). Reference numeral 7 designates a positive type resist.

The production method will be described.

Figure 2A:
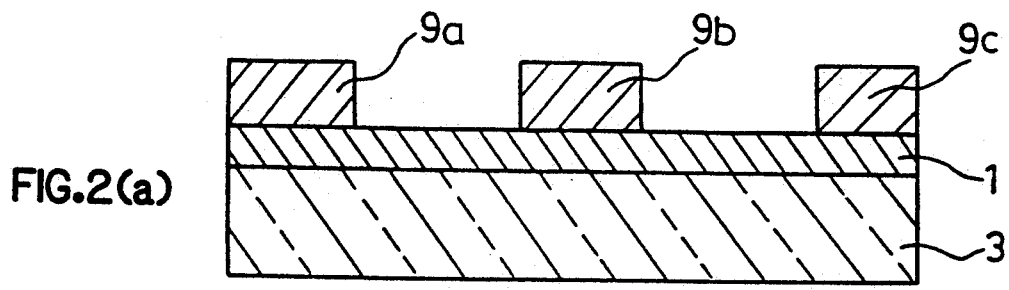
FIGS. 2(a) to 2(e) are diagrams illustrating a method of producing a mask pattern according to a first embodiment of the present invention.
Figure 2B:
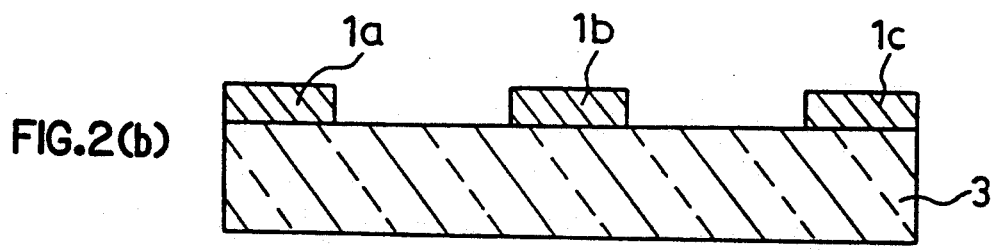

Light shielding film 1 comprising metal such as Cr or MoSi is deposited on the entire surface of the glass substrate 3 by evaporation, a resist film is deposited thereon, the resist is exposed to produce required patterns 9a to 9c using such as electron beam exposure method as shown in FIG. 2(a), and after development, parts of the light shielding film 1 are removed by etching using the resist patterns 9a to 9c as a mask, thereby producing the light-shielding film patterns 1a to 1c as shown in FIG. 2(b). The light shielding films 1a to 1c are required to be grounded to prevent from charging of the substrate during the electron beam irradiation.

Figure 2C:
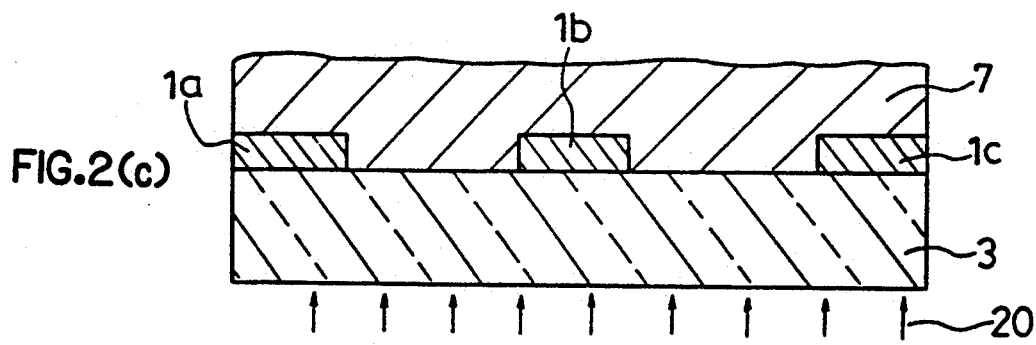
Figure 2D:
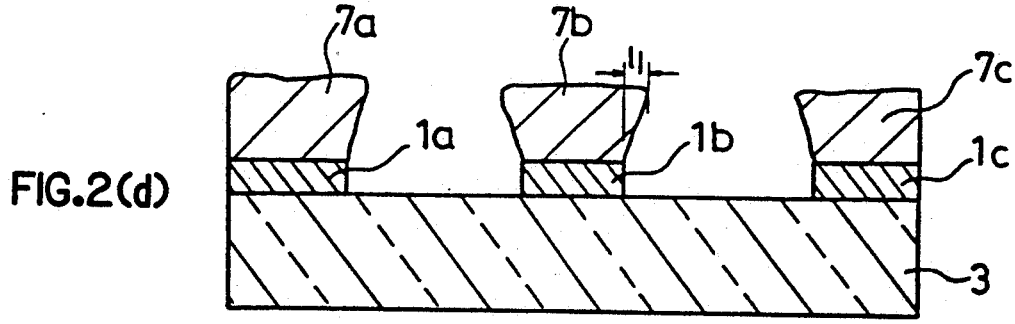

Next, a positive resist 7 is deposited on all surfaces so as to cover the light shielding film patterns 1a to 1c. Ultraviolet rays from rear surface of the glass substrate 3 expose resist 7 as shown in FIG. 2(c), and produce overhanging configuration resist patterns 7a to 7c on the light shielding film patterns 1a to 1c as shown in FIG. 2(d). At this time, the overhanging value $l_1$ of the resist patterns 7a to 7c shown in FIG. 2(d) is easily determined by the exposure light amount, the thickness of resist 7, and the developing conditions. That is, the value of $l_1$ may be determined so as to be equal to the space between the shifting film pattern and the light shielding film pattern in the mask pattern which is finally produced.

Figure 2E:
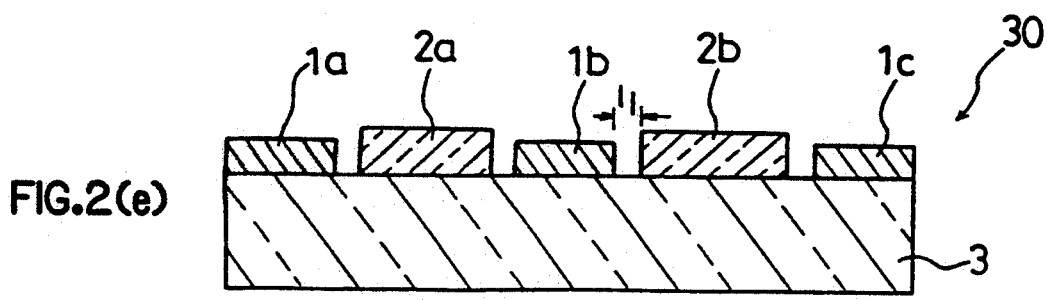

Next, an insulating film such as SiO or SiN which is to be a light shifting film is deposited by evaporation on the entire surface. Here the thickness of the shifting film d is the value represented by formula 1. Thereafter, light shielding films pattern 2a and 2b of the present invention are completed by lift-off as shown in FIG. 2(e).

FIGS. 3(a) to 3(e) show a second method of producing a mask pattern 30 according to the present invention. In these figures, like elements are given the same numerals as those in FIG. 1(a). Reference numerals 8, 8a to 8c designate photoresists. Reference numeral 2 designates a shifting film.

Figure 3A:
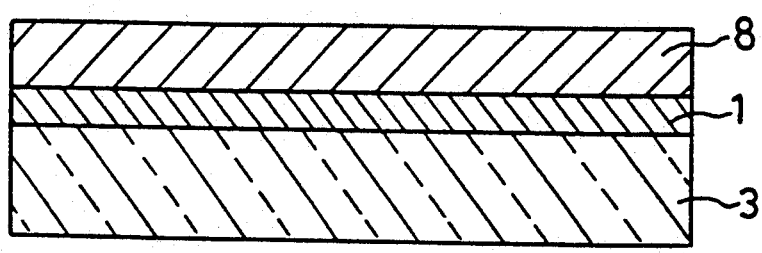
FIGS. 3(a) to 3(e) are diagrams illustrating a method of producing a mask pattern according to a second embodiment of the present invention.

In FIG. 3(a), a film comprising such as Cr or MoSi which is to be the light shielding film 1 is deposited by evaporation on the entire surface of the transparent glass substrate 3, such as quartz glass, and a photoresist 8 is deposited thereon.

Next, the photoresist 8 is exposed to an electron beam to produce a required pattern. At this time, the width of the pattern $l_2$ is larger than that of the required shifting film pattern by a value corresponding to the spacing between the shifting film pattern and the light shielding film pattern (approximately 0.5 to 1.0 micron). For example, when a shifting film pattern of 2 microns is produced with spacing of 0.5 microns from the light shielding film pattern, the width of pattern to be exposed with light $l2=2+0.5\times2=3$ microns.

Figure 3B:
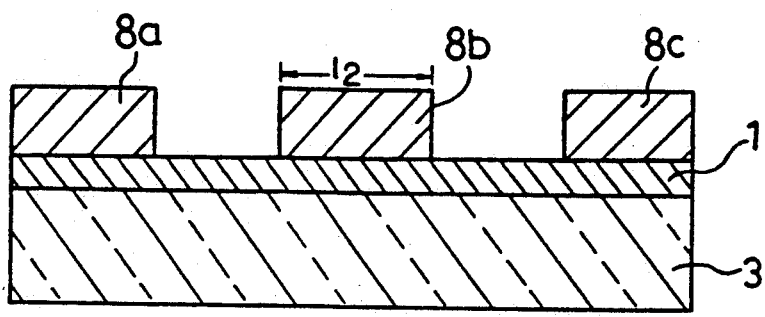

Thereafter, the resist is developed, thereby obtaining resist patterns 8a to 8c as shown in FIG. 3(b).

Figure 3C:
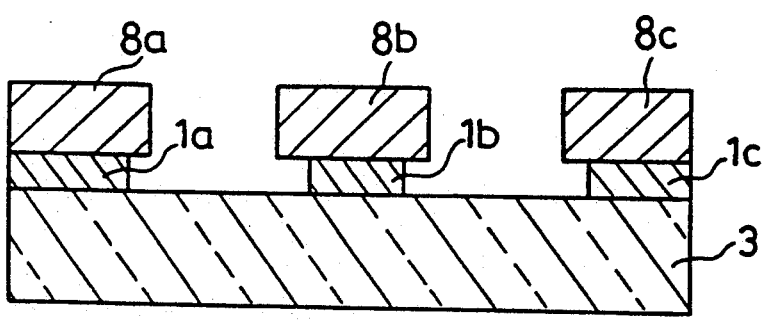

By carrying out over-etching by such as wet etching using a mixture of acids and the resist patterns 8a to 8c as masks, the width of the light shielding film 1 is reduced to be equal to the desired width of the light shielding film pattern (for example, 2 microns), thereby obtaining the structure of FIG. 3(c).

Figure 3D:
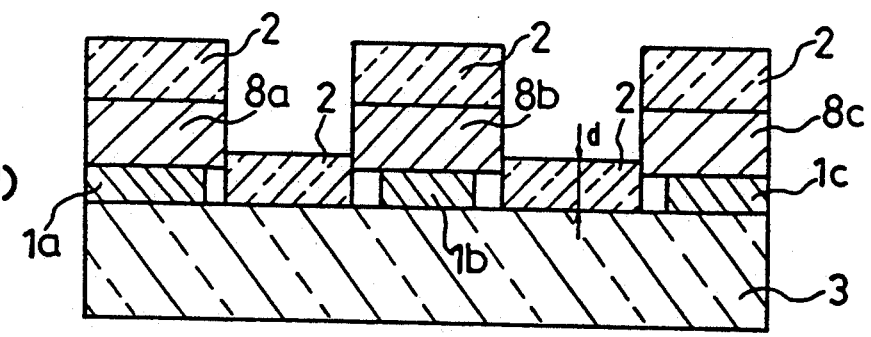

Thereafter, an insulating film which is to be a light shifting film 2 is deposited on the entire surface by evaporation to produce the structure of FIG. 3(d). Here, the thickness d of the shifting film 2 is the value represented by formula 1.

Figure 3E:
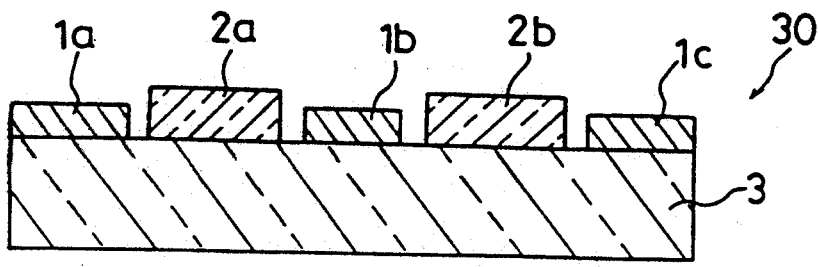
Figure 4A:
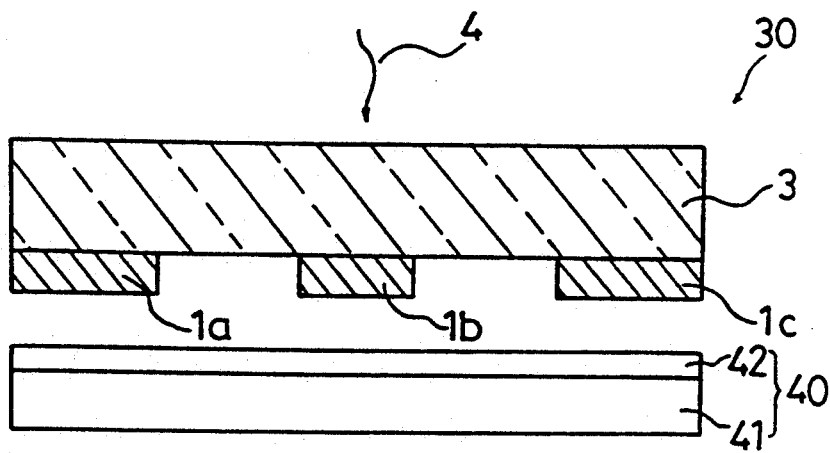
FIGS. 4(a) to 4(d) are diagrams for explaining the principle of patterning a mask pattern according to the prior art.
Figure 4B:
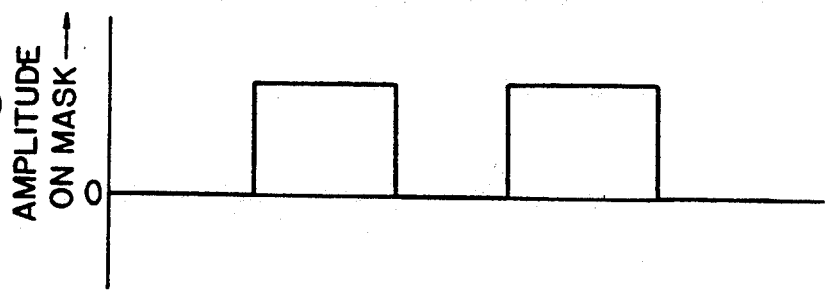
Figure 4C:
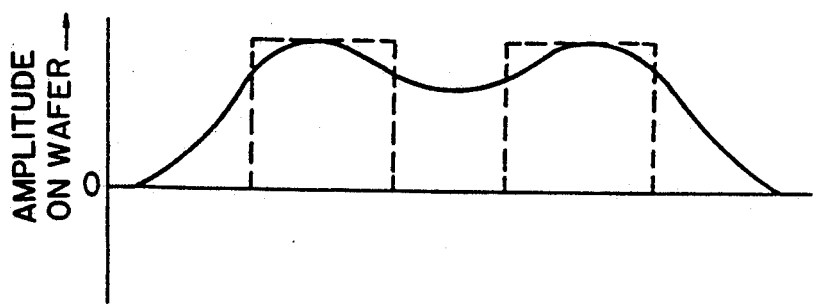
Figure 4D:
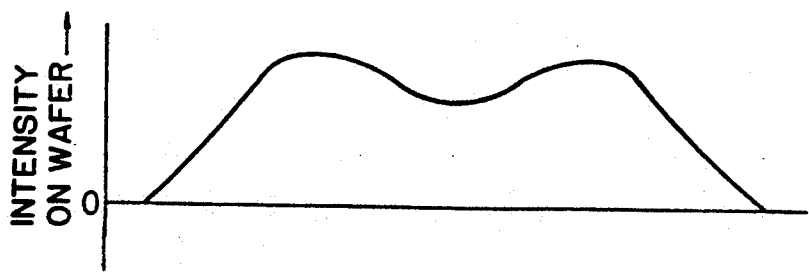
Figure 6A:
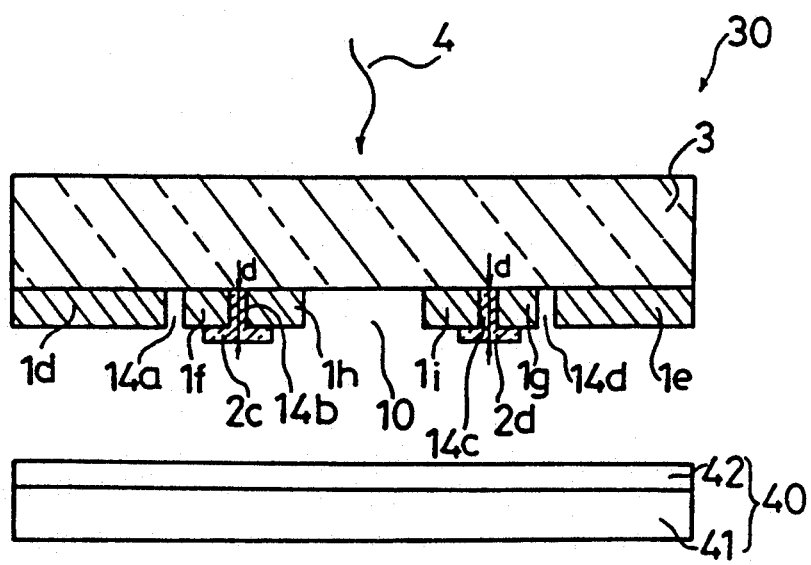
FIGS. 6(a) to 6(d) are diagrams for explaining the principle of patterning in the phase-shifting method used in the prior art mask pattern.
Figure 6B:
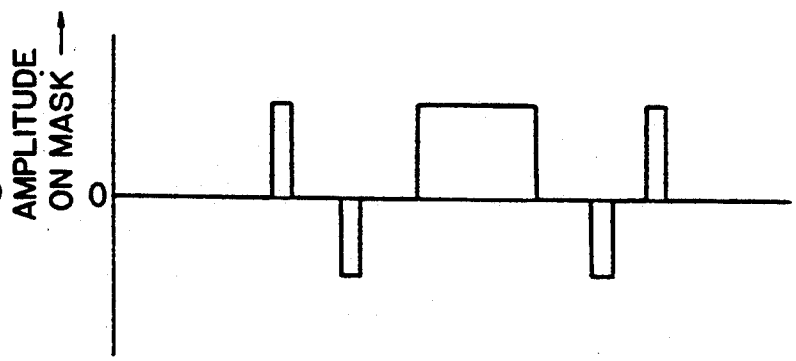
Figure 6C:
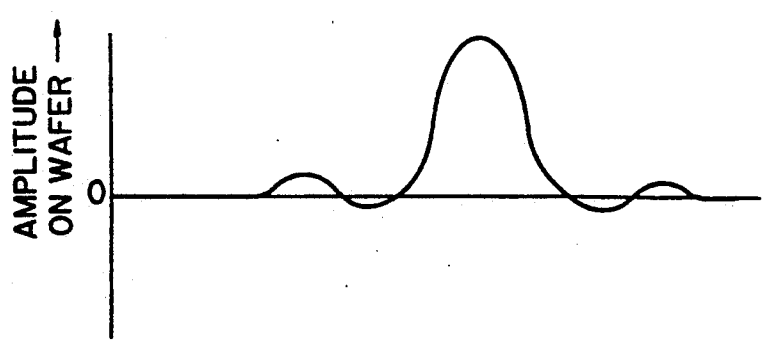
Figure 6D:
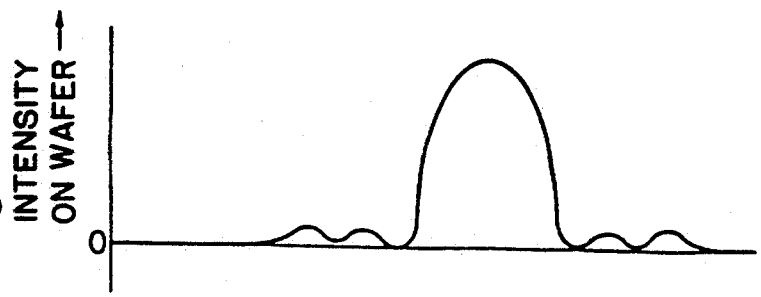
Figure 7A:
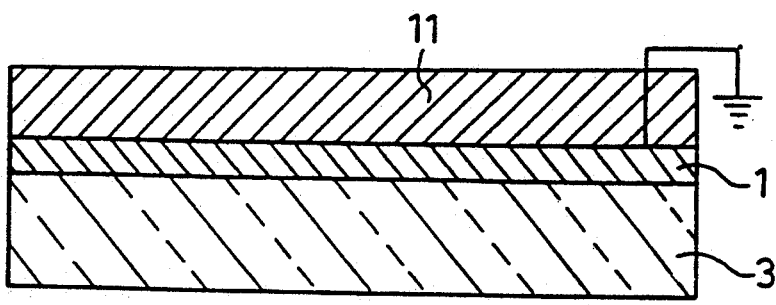
FIGS. 7(a) to 7(f) are diagrams illustrating a method of producing the mask pattern of FIG. 5.
Figure 7B:
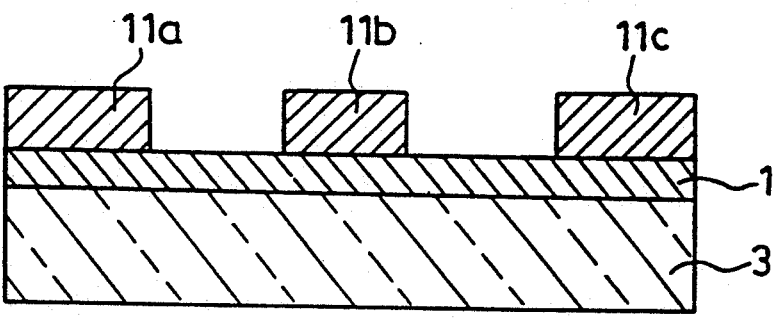
Figure 7C:
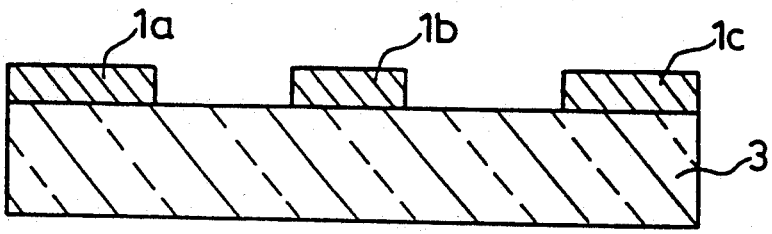
Figure 7D:
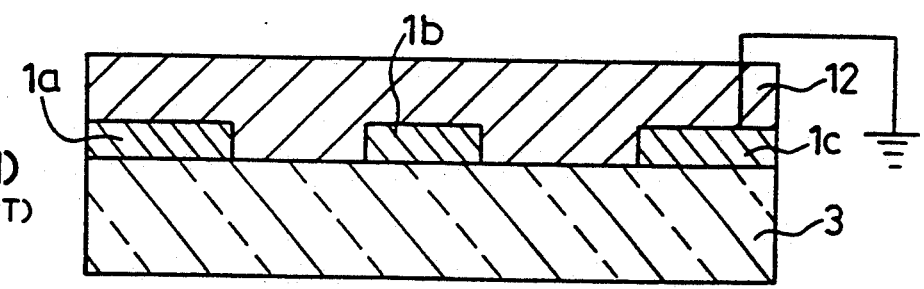
Figure 7E:
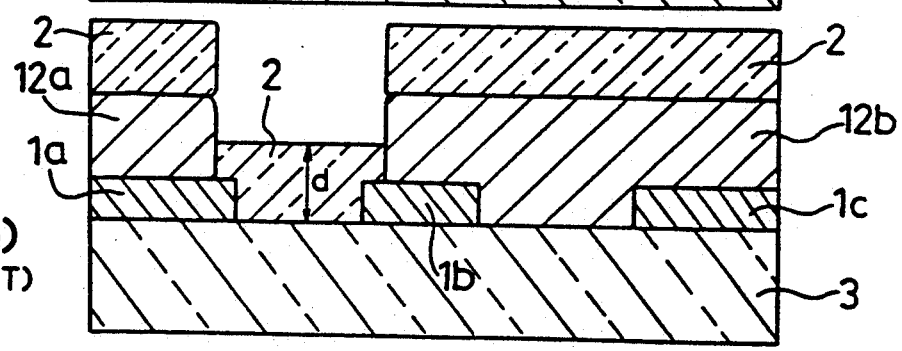
Figure 7F:
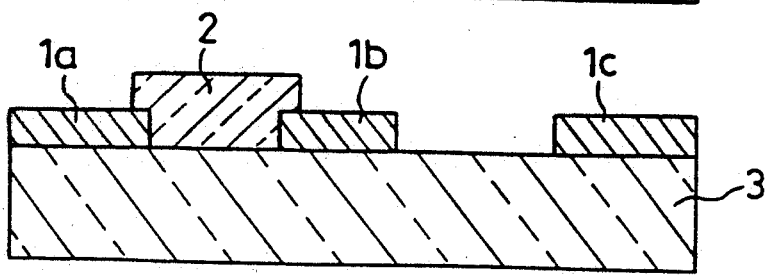
Figure 8A:
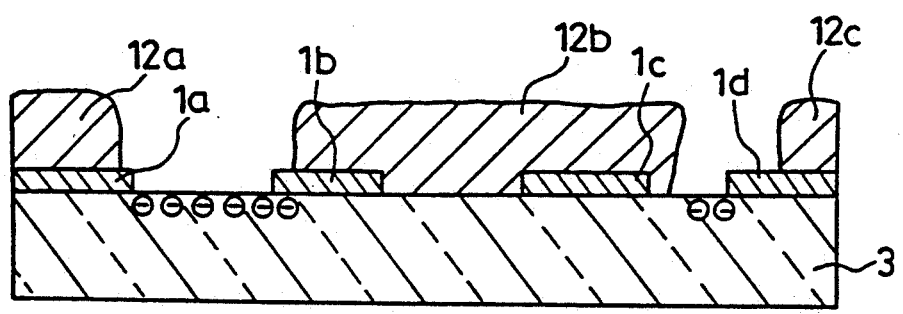
FIGS. 8(a) and 8(b) are diagrams for explaining the problems in the method of producing a mask pattern of figure 7(f) and FIG. 9 is a schematic diagram showing a reducing projection exposure apparatus.
Figure 8B:
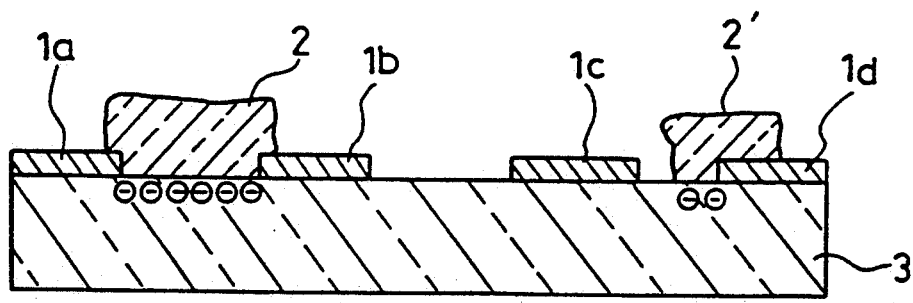

The photoresist elements 8a to 8c and the insulating film which is on the light shielding film patterns 1a to 1c are removed by lift-off thereby obtaining the light shifting films pattern 2a and 2b of the present invention as shown in FIG. 3(e).

In the embodiments of the present invention shown in FIGS. 2(e) and 3(e), shifting film patterns 2a and 2b are self-alignedly provided with a spacing of predetermined distance from the light shielding film patterns 1a to 1c without any overlap on the light shielding film pattern as in the prior art method. Therefore, there is no problem of deviation in the shifting film pattern position due to charging of the substrate by the electron beam exposure which has been a problem in the prior art method, and the shifting film pattern can be produced with high controllability and high reproducibility by a simple method.

As is evident from the embodiment, according to the present invention, since the mask pattern comprises a shifting film having a certain spacing from the light shielding film pattern, when this mask pattern is used in an optical reducing projection exposure apparatus using a single wavelength, the resolution and the contrast of pattern image projected on the wafer are enhanced, and the resolution and the depth of focus of the photoresist to be patterned are improved. This provides a great improvement in producing a fine patterned semiconductor device.

In addition, in the production method according to the present invention, a photoresist is deposited onto the surface of a glass substrate on which light shielding film patterns are produced, optical-exposure is executed from the rear surface of the glass substrate, developing is performed, resist films are produced in overhanging configuration on the light shielding film patterns, a shifting film is deposited by evaporation at a desired thickness and shifting film patterns are produced by lift-off at a place between the light shielding film patterns with spacing of a predetermined distance from the light shielding film patterns. Therefore, without using an electron beam exposure method, the shifting film can be produced self-alignedly with high controllability and reproducibility by the simple production method.

Furthermore, in the production method according to the present invention, a photoresist is plated onto the light shielding film which is produced on the entire surface of the glass substrate, a pattern having a larger width than desired light shielding film pattern is produced by electron beam exposure, the light shielding film is overetched to a desired pattern width, and a shifting film is vapor deposited to a desired thickness and shifting film patterns are produced by lift-off separated from the light shielding film patterns. Therefore, it is possible to produce self-alignedly the shifting film with high precision.

What is claimed is:

1. A method of producing a mask for use in an optical exposure apparatus using single wavelength light comprising the steps of:
   producing a light shielding film pattern including at least two spaced apart portions of a desired width and with an intervening aperture on a front surface of a transparent substrate;
   depositing a positive photoresist film covering said light shielding film pattern and intervening portions of said substrate;
   exposing said positive type photoresist film to light from the rear surface of said transparent substrate using said light shielding film pattern as a mask;
   developing said positive photoresist film, leaving portion of said photoresist film on and overhanging said respective portions of said light shielding film;
   depositing a transparent thin shifting film for shifting the phase of light transmitted through said mask on the surface of said transparent substrate and said portions of said photoresist film overhanging said respective portions of said light shielding film by evaporation; and
   lifting off said portions of said positive photoresist film and the shifting film overlying said portions of said positive photoresist film, thereby producing a transparent thin shifting film portion in the aperture between said light shielding film portions and spaced from said light shielding film portions.

2. A method of producing a mask as defined in claim 1 including depositing said transparent thin film pattern having an index of refraction n for shifting the phase of light of wavelength λ to a thickness d where $$D = \lambda/2\,(n-1)$$

3. A method of producing a mask as defined in claim 1 including forming said transparent thin film pattern portion to a width of (m×n) microns so that a pattern of m microns in width is imaged on a wafer by using a 1/n reducing projection exposure apparatus, where n is a number.

4. A method of producing a mask for use in an optical exposure apparatus using single wavelength light comprising the steps of:
   depositing a light shielding film on the entire surface of a transparent substrate;
   producing a photoresist pattern including at least two spaced apart portions on said light shielding film;
   over-etching the light shielding film using said photoresist portions as a mask and undercutting said photoresist portions to produce light shielding film portions having a desired width;
   depositing a transparent thin film for shifting the phase of light transmitted through said mask on the photoresist portions and the exposed portions of said substrate; and
   lifting off said portions of said photoresist film and the shifting film overlying said photoresist portions, thereby producing a transparent thin shifting film portion in the aperture between said light shielding film portions and spaced from said light shielding film portions.

5. A method of producing a mask as defined in claim 4 including depositing said transparent thin film pattern having an index of refraction n for shifting the phase of light of wavelength λ to a thickness d where $$D = \lambda/2\,(n-1)$$

6. A method of producing a mask as defined in claim 4 including forming said transparent thin film pattern portion to a width of (m×n) microns when a pattern of m microns in width is to be imaged on the wafer by using a 1/n reducing projection exposure apparatus, where n is a number.

* * * * *